(12) United States Patent
Cuvalci et al.

(10) Patent No.: US 9,633,889 B2
(45) Date of Patent: Apr. 25, 2017

(54) SUBSTRATE SUPPORT WITH INTEGRATED VACUUM AND EDGE PURGE CONDUITS

(71) Applicant: APPLIED MATERIALS, INC., Santa Clara, CA (US)

(72) Inventors: Olkan Cuvalci, Sunnyvale, CA (US); Gwo-Chuan Tzu, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 408 days.

(21) Appl. No.: 13/787,397

(22) Filed: Mar. 6, 2013

(65) Prior Publication Data

US 2014/0252710 A1  Sep. 11, 2014

(51) Int. Cl.
*H01L 21/683* (2006.01)
*H01L 21/687* (2006.01)

(52) U.S. Cl.
CPC ...... *H01L 21/6838* (2013.01); *H01L 21/6875* (2013.01)

(58) Field of Classification Search
None
See application file for complete search history.

(56) References Cited

U.S. PATENT DOCUMENTS

| | | | | |
|---|---|---|---|---|
| 5,230,741 | A * | 7/1993 | van de Ven | C23C 16/04 118/720 |
| 5,356,476 | A * | 10/1994 | Foster et al. | 118/725 |
| 5,624,499 | A * | 4/1997 | Mizuno | C23C 16/45521 118/715 |
| 6,040,011 | A * | 3/2000 | Yudovsky et al. | 427/255.28 |
| 6,179,924 | B1 | 1/2001 | Zhao et al. | |
| 6,464,790 | B1 * | 10/2002 | Sherstinsky | C23C 16/45521 118/500 |
| 6,730,175 | B2 * | 5/2004 | Yudovsky | C23C 16/45521 118/500 |
| 2003/0029610 | A1 * | 2/2003 | Moslehi | 165/206 |
| 2003/0148035 | A1 * | 8/2003 | Lingampalli | 427/421 |
| 2005/0036267 | A1 * | 2/2005 | Savas | C23C 16/4586 361/234 |
| 2006/0219176 | A1 * | 10/2006 | Tomita | H01L 21/67103 118/725 |
| 2007/0040265 | A1 * | 2/2007 | Umotoy et al. | 257/704 |
| 2009/0235866 | A1 * | 9/2009 | Kataigi | C23C 16/45521 118/725 |
| 2009/0283217 | A1 * | 11/2009 | Lubomirsky et al. | 156/345.34 |

* cited by examiner

*Primary Examiner* — Joseph J Hail
*Assistant Examiner* — Brian Keller
(74) *Attorney, Agent, or Firm* — Moser Taboada; Alan Taboada

(57) ABSTRACT

Substrate supports are provided herein, In some embodiments, a substrate support includes a first plate; a plurality of vacuum passages disposed through the first plate; a plurality of vertical passages formed partially into the first plate; a plurality of horizontal passages disposed in the first plate, each of the plurality of horizontal passages beginning proximate a perimeter of the first plate and terminating proximate one of the plurality of vertical passages such that the horizontal passages and the vertical passages are in fluid communication; a second plate coupled to the first plate at an interface; an elongate shaft having a vacuum line and an edge purge line internal to the shaft; a vacuum channel formed at the interface fluidly coupling the vacuum line to the plurality of vacuum passages; and an edge purge channel formed at the interface fluidly coupling the edge purge line to the plurality of vertical passages.

20 Claims, 8 Drawing Sheets

SUBSTRATE SUPPORT WITH INTEGRATED VACUUM AND EDGE PURGE CONDUITS

FIELD

Embodiments of the present invention generally relate to semiconductor processing equipment.

BACKGROUND

Atomic layer deposition (ALD) and chemical vapor deposition (CVD) are two common methods used in semiconductor fabrication to deposit thin films on a substrate. The processes deliver gases to a process chamber and onto a substrate where the gases react and form a thin film on the substrate. In some cases, deposition of a film on the edge or backside of the substrate is not desirable. Edge purge gas may be provided to prevent deposition at the edge of the substrate, often through channels in a substrate support member such as a support plate. Edge purge gas may help prevent backside deposition as well.

With some substrate supports, an edge region of a substrate rests upon a raised portion adjacent to the perimetrical edge of a support plate, with projections within the perimeter supporting interior portions of the substrate. A vacuum is often used to hold the substrate down to the substrate support, with the vacuum sometimes assisting in sealing the substrate against the raised portion of the support plate to lessen infiltration of process gasses to the backside of the substrate.

It is often desirable to supply the edge purge gas and vacuum through channels formed within the substrate support plate. Edge purge gas and vacuum supply channels in typical substrate supports are prone to inconsistent or unpredictable flow characteristics. Further, edge purge gas and vacuum supply channels in typical substrate supports can experience fluid leaks in operation, contributing to inconsistent or unpredictable flow characteristics of the channels.

Vacuum formation and purge gas flow are some of the considerations in determining processing parameters. Accordingly, the provision of an adequate and predictable vacuum and flow of edge purge gas are generally necessary to establish desirable processing parameters. It is generally desirable to maintain the fluid tight nature of these channels at least to maintain repeatable processes. It is also often desirable to keep the edge purge gas free of contamination, which may come from materials used to form the plate. Easily establishing and maintaining the integrity of the channels and any fluid tight seals between, for example, between the plate and the support shaft having integrated vacuum and edge purge lines, has presented difficulty in some substrate supports.

Current support plates typically require difficult and time consuming manufacturing operations to create channels capable of providing adequate and predictable edge purge gas and vacuum to the desired regions of the support plate.

Therefore, a need exists for a substrate support with easily formed edge purge gas and vacuum channels to provide adequate and predictable edge purge gas and vacuum to the support plate. A need also exists for a substrate support with edge purge gas and vacuum channels that can be maintained in a contaminant-free and fluid-tight condition while in operation.

SUMMARY

Embodiments of substrate supports are provided herein. In some embodiments, a substrate support includes a first plate; a plurality of vacuum passages disposed through the first plate; a plurality of vertical passages formed partially into the first plate; a plurality of horizontal passages disposed in the first plate, each of the plurality of horizontal passages beginning proximate a perimeter of the first plate and terminating proximate one of the plurality of vertical passages such that the horizontal passages and the vertical passages are in fluid communication; a second plate coupled to the first plate at an interface; an elongate shaft having a vacuum line and an edge purge line internal to the shaft; a vacuum channel formed at the interface fluidly coupling the vacuum line to the plurality of vacuum passages; and an edge purge channel formed at the interface fluidly coupling the edge purge line to the plurality of vertical passages.

In some embodiments, a substrate support includes a plate that has a first surface, an opposing second surface, and a thickness bounded by the first and second surfaces; a rim raised above the first surface, the rim including a sealing surface comprising a discontinuous coating; a plurality of vacuum passages formed through the plate thickness and the first and second surfaces; a plurality of vertical passages formed through the second surface and partially through the plate thickness; and a plurality of horizontal passages disposed in the thickness of the plate, each of the plurality of horizontal passages beginning at a perimeter of the plate, and terminating at one of the plurality of vertical passages such that the horizontal passages and the vertical passages are in fluid communication.

In some embodiments, a substrate support includes a first plate having a first surface, an opposing second surface, and a thickness bounded by the first and second surfaces; a plurality of vacuum passages formed through the thickness and the first and second surfaces; a plurality of vertical passages formed through the second surface and partially through the first plate; and a plurality of horizontal passages disposed in the first plate, each of the plurality of horizontal passages beginning proximate a perimeter of the first plate, and terminating near one of the plurality of vertical passages such that the horizontal passages and the vertical passages are in fluid communication. A second plate is provided comprising a top surface and an opposing bottom surface, wherein the top surface of the second plate is coupled to the second surface of the first plate at an interface. an elongate shaft is provided comprising a first end and an opposite second end, wherein the shaft further includes: a vacuum line internal to the shaft, the vacuum line having a first end at the first end of the shaft; and an edge purge line internal to the shaft, the edge purge line having a first end at the first end of the shaft. A vacuum channel is formed at the interface such that the vacuum channel is in fluid communication with the vacuum line. And an edge purge channel is formed at the interface, such that the edge purge channel is in fluid communication with the edge purge line and the vertical passages.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
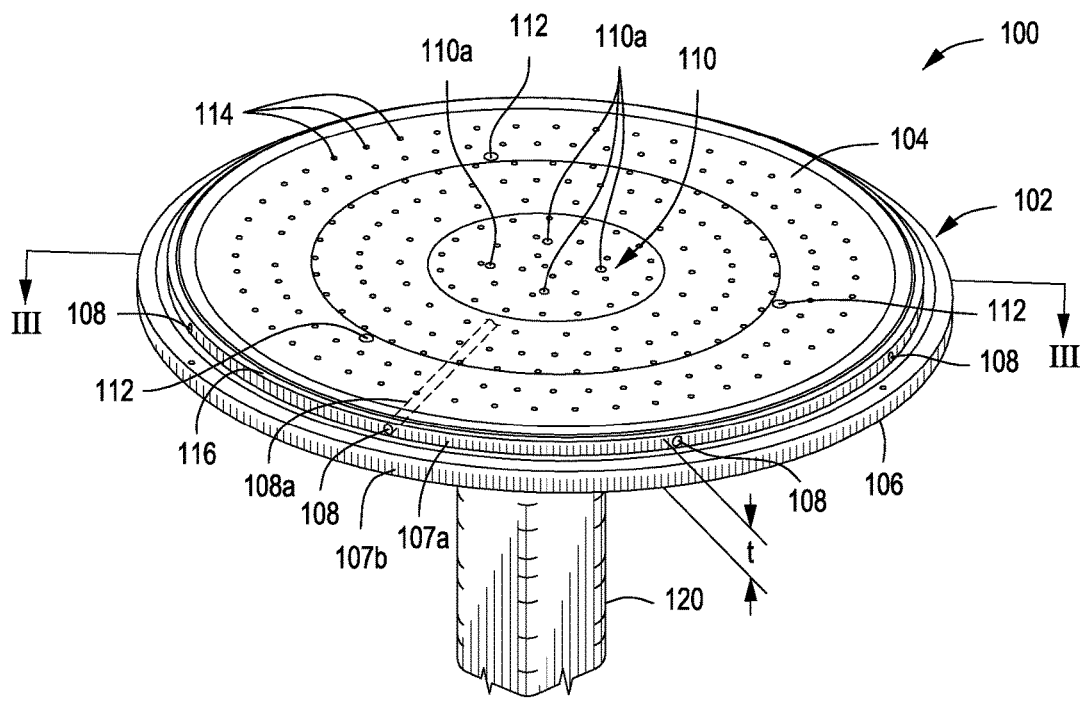
FIG. 1 depicts a top isometric view of a substrate support according to some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Support of a substrate during semiconductor fabrication may be provided by substrate supports in accordance with embodiments disclosed herein. Embodiments may provide one or more of improved vacuum supply or distribution, improved edge purge gas supply or distribution, and a decrease in backside contamination. Furthermore, substrate supports in accordance with embodiments disclosed herein may provide greater ease in manufacturing and assembly and improved performance and durability in operation.

In some deposition processes, a substrate rests upon support elements of a support member, for example, the perimetral edge of the substrate may rest upon a perimeter support element, such as a plate rim, with projections or bumps within the perimeter supporting the interior portions of the substrate. In some embodiments, a sealing surface is provided at least on the perimeter support element to seal the underside of the substrate from infiltration of process gases, further lessening, or eliminating, backside deposition. The substrate may be held down to the support elements with the aid of a vacuum applied to the underside of the substrate. The vacuum may be applied through channels provided in the support plate. For many substrate processes, a predictable and controllable vacuum is desirable to facilitate application of a consistent hold down force to the back of the substrate.

FIG. 1 depicts a substrate support 100 in accordance with some embodiments of the present invention. The substrate support 100 comprises a first plate 102 and a shaft 120 that may be affixed to the plate. The first plate 102 comprises a top or first surface 104, an opposing substantially planar bottom or second surface 106, and a thickness t measured generally perpendicularly to the surfaces. In some embodiments, the first surface 104 may be planar and parallel to the second surface 106. In other embodiments, the first surface 104 may vary from the center of the plate to the outer perimeter. In some cases, the first surface 104 is generally upward sloping from the center of the first plate 102 outward to the perimeter 107a, i.e., the thickness t may increase radially. Conversely, the first surface 104 may be generally downward sloping from the center of the first plate 102 outward to the perimeter 107a, i.e., the thickness t may decrease radially.

The shaft 120 may be coupled to the second surface 106. In other embodiments, the shaft 120 may be formed with, or coupled to, a second plate (described below), and the second plate further coupled to the second surface 106 of the first plate 102.

Throughout this description, "vertical hole" is used to mean a hole formed in one or both of the first surface 104 and the second surface 106. Similarly "vertical passage" is used to mean a passage formed by the continuation of a vertical hole at least partially through the thickness t. A vertical passage may be generally perpendicular to one of the first and second surfaces 104, 106.

In some embodiments, the first plate 102 has a stepped edge configuration and comprises more than one perimeter (e.g., a perimeter corresponding to each vertical edge of the plate). As illustrated, the first plate 102 comprises two perimeters, 107a and 107b. Additional steps forming more than two perimeters are contemplated. In other embodiments, the first plate 102 does not have a stepped edge configuration and has only one perimeter.

A plurality of horizontal holes 108 (four shown in FIG. 1) are formed in the thickness of the first plate 102 through a perimeter 107a forming horizontal passages 108a (one shown in phantom in FIG. 1). Throughout this description, "horizontal hole" is used to mean a hole formed in a perimeter, for example perimeter 107a or perimeter 107b, of the first plate 102. Similarly "horizontal passage" is used to mean a passage formed by the continuation of a horizontal hole directed towards the interior of the first plate 102. Horizontal passages 108a extend from the perimeter 107a into the plate thickness, and terminate at a position at the interior to the first plate 102 to be described more fully below. Generally, the horizontal passages 108a are straight and substantially parallel to at least one of the first surface 104 and the second surface 106, and are radially directed, although the horizontal passages 108a may be otherwise directed. Horizontal holes 108 may be formed in the perimeter 107b in addition to those formed in the perimeter 107a, or in place of those formed in 107a. Some horizontal holes may be formed in the perimeter 107a and others may be formed in the perimeter 107b.

A plurality of vacuum holes 110 are formed through the plate thickness t and first and second surfaces 104, 106, respectively, forming vacuum passages 110a (four shown).

The first plate 102 may also include a plurality of lift pin holes 112 (three shown) with corresponding lift pins (not shown), a plurality of substrate support elements 114 raised above the first surface 104 the first plate 102, the support elements having upper support surfaces 115 (FIG. 1C), and a rim 116 raised above the first surface 104. The substrate support elements 114 are located within the interior region circumscribed by rim 116. In some embodiments, the rim 116 and the substrate support elements 114 are substantially coplanar. The rim 116 may provide a sealing surface 122 suitable for sealing against the backside at the perimeter of a substrate 124 (partially shown in FIG. 1C) supported thereon. A sealing surface is often desirable at least on the rim 116 to provide a seal adequate to establish a pressure or vacuum condition in the volume 126 between the substrate backside surface 125 and the first surface 104 of the first plate 102. In some cases, the sealing surface 122 may comprise a coating 123. The coating 123 may, in non-limiting examples, enhance the sealing properties of the rim 116 and/or may prevent, or substantially prevent, contamination of the substrate 124 due to contact with the rim 116. Other benefits may be realized from use of the coating 123 on the sealing surface 122. As illustrated in FIG. 1C, substrate support elements 114 may also comprise a coating 127 which may or may not be the same coating as the coating 123.

Figure 1A:
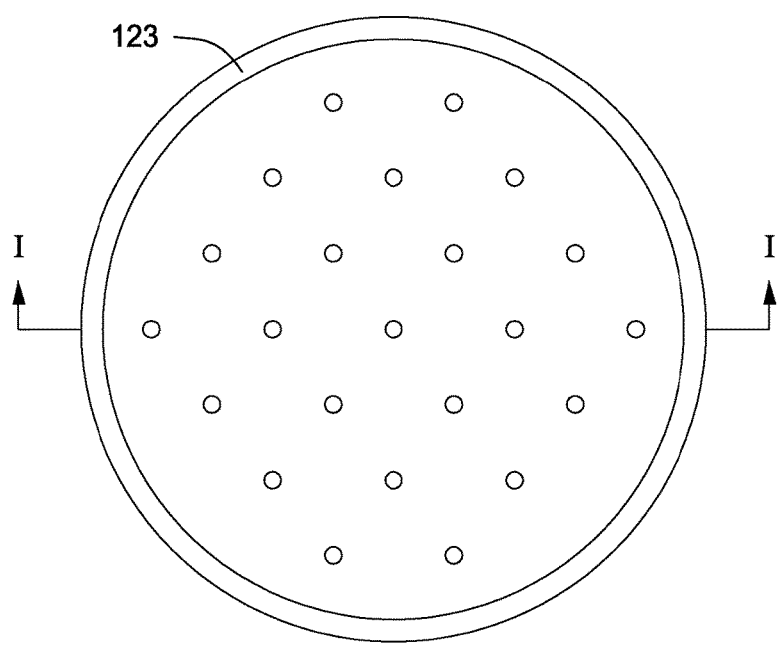
FIGS. 1A and 1B depict plan views of a substrate support in accordance with embodiments of the present invention.
Figure 1B:
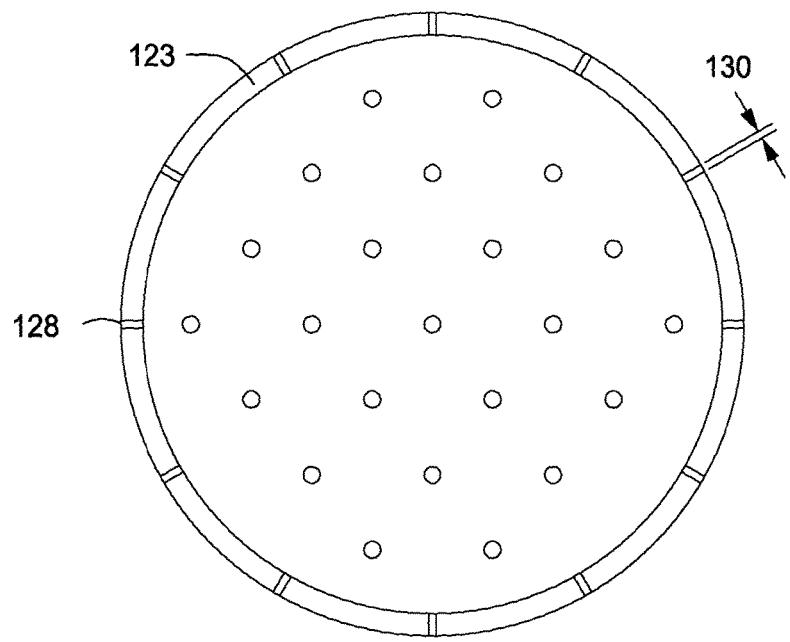
Figure 1C:
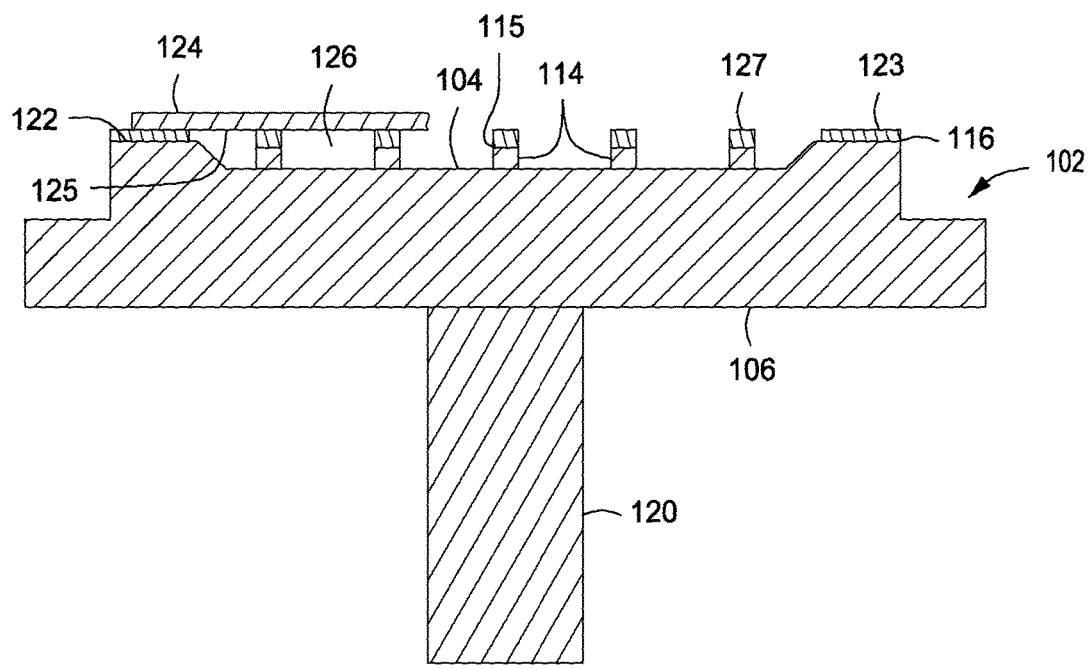
FIG. 1C depicts a sectional side view of the substrate support of FIG. 1A taken along line I-I of FIG. 1A.

In a non-limiting example, coating 123 may be a continuous coating as shown in FIG. 1A. In other embodiments, coating 123 may be a discrete or discontinuous coating as illustrated in FIG. 1B. The coating may be formed with discontinuities or gaps 128, or the coating may be formed as a continuous coating (FIG. 1A) with gaps 128 subsequently formed in the coating. The gaps 128 are sized so as to not adversely affect the creation of a pressure or vacuum condition in the volume 126. The gaps 128 may also be sized to prevent the introduction of process gasses to the backside of the substrate. In some embodiments, the gaps 128 may illustratively have a width 130 of about 50 mils, although other widths may be used. Provision of a coating 123 that is discontinuous, for example having gaps 128, advantageously minimizes the risk of delamination of the coating 123 due to differences in the thermal expansion and contraction of the coating 123 as compared to that of the underlying surface. The coating 123 may comprise non-metallic materials including, as a non-limiting example, aluminum oxide ($Al_2O_3$).

The coating 127 on the substrate support elements may be processed in a manner similar to the coating 123 of the rim 116. In some embodiments the coating 123 and the coating 127 are coplanar or substantially coplanar. In other embodiments, the coating 123 and the coating 127 are not coplanar. In yet other embodiments, the surfaces of the substrate support elements 114 with the coating 127 may vary in height with respect to the coating 123 on the rim 116 such that a substrate urged in contact with substantially all of the substrate supports would form a concave, a convex, or other curved surface.

Figure 2:
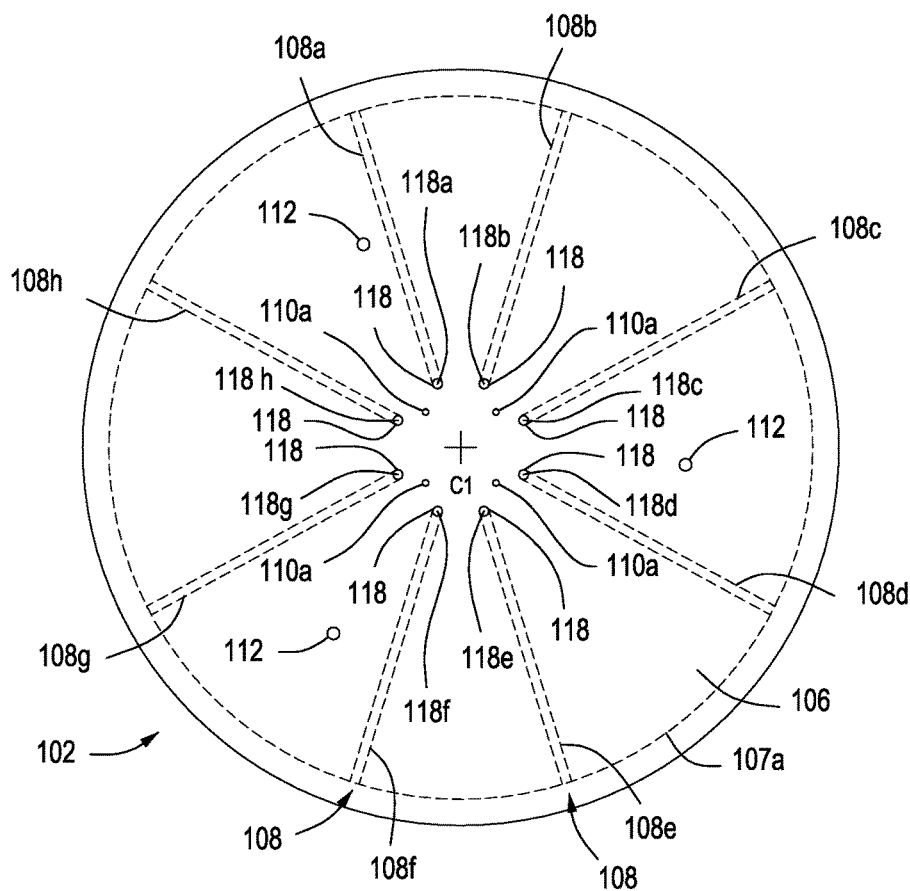
FIG. 2 depicts a bottom view of a plate suitable for use in a substrate support in accordance with some embodiments of the present invention.

FIG. 2 is illustrative of the bottom or second surface 106 of the first plate 102 in accordance with some embodiments of the present invention. Vacuum passages 110a are disposed through the thickness of the plate and the first surface 104 (not shown in FIG. 2) and the second surface 106. Four vacuum passages 110a are shown but any convenient number may be used. Vacuum passages 110a may be sized, shaped, and further configured such that desirable vacuum characteristics can be achieved.

Figure 2A:
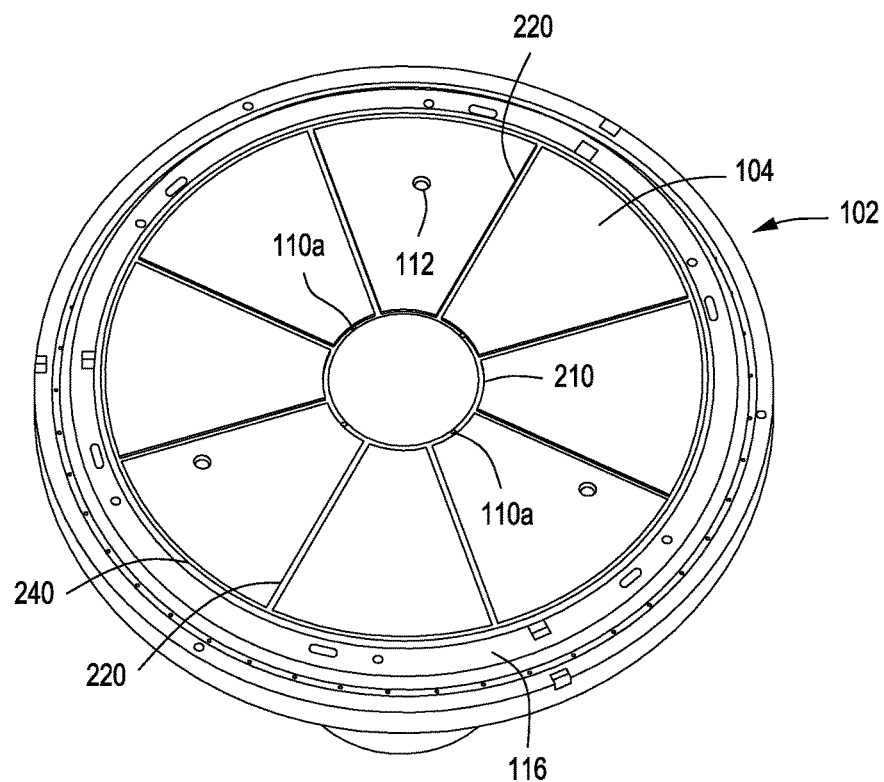
FIG. 2A depicts a top isometric view of a substrate support in accordance with some embodiments of the present invention.

In a non-limiting embodiment illustrated in FIG. 2A, a plurality of vacuum passages 110a (4 shown) terminate at the first surface 104 in fluid communication with first distribution channel 210 formed in the first surface 104. For ease of illustration, first distribution channel 210 is shown as a continuous circular ring-like channel, however, the first distribution channel may be discontinuous, or may comprise discontinuous segments, and may not be circular in shape.

In some non-limiting embodiments as illustrated in FIG. 2A, a plurality of radial distribution channels 220 (8 shown) extend outwardly from the first distribution channel 210 and terminate in fluid communication with second distribution channel 240 proximate rim 116. Second distribution channel 240 is shown as a continuous circular ring-like channel for ease of illustration, however, the second distribution channel may be discontinuous, or may comprise discontinuous segments, or may not be circular in shape.

First distribution channel 210, second distribution channel 240, and radial distribution channels 220 may be sized, shaped, or configured as desired, for example, to enhance balanced vacuum distribution within rim 116. The inventors have noted improved uniformity in vacuum formation at least at the perimeter of the wafer with the disclosed arrangement of concentric distribution channels joined by radial distribution channels.

Any appropriate number of lift pin holes 112 (three shown) may also be formed through the thickness t of the first plate 102 and first and second surfaces 104, 106 to accommodate lift pins for positioning the substrate on, and removing the substrate from, substrate support elements 114.

Returning to FIG. 2, a plurality of generally vertical holes 118 (8 shown) forming vertical passages 118a-118h are formed through the second surface 106 and terminate within the thickness t of the first plate 102 without breaking through the first surface 104. Vertical holes 118 sometimes known as blind holes, and vertical passages 118a-118h sometimes known as blind passages, may be formed using, as non-limiting examples, drilling, boring, or milling. More than 8 vertical passages, or fewer than 8 vertical passages, may be used in various embodiments of the present invention.

Eight horizontal holes 108, forming 8 horizontal passages 108a-108h are shown in phantom lines in FIG. 2 in a non-limiting example. The horizontal passages 108a-108h extend from perimeter 107a and each terminate at a vertical passage 118a-108h. Horizontal holes 108 and passages 108a-108h may be formed using, as non-limiting examples, drilling, boring, milling, or gun drilling. Horizontal passages 108a-108h and vertical holes 118 are formed or otherwise disposed such that fluid communication is established between each hole and the associated passage. Horizontal holes 108 and vertical holes 118 may be formed using the same process, or different processes, and the holes may be the same size, or may be different sizes. Horizontal passages 108a-108h and vertical passages 118a-118h may be the same size or shape, or may have different sizes or shapes. Horizontal passages 108a-108h may differ from each other in size, shape, length, or other flow affecting characteristic, or may be the same size, shape, or length. Horizontal passages 108a-108h and vertical passages 118a-118h may vary in size or shape along their length. Similarly, vertical passages 118a-118h may differ from each other in size or shape, or may be the same size or shape, and may differ in size or shape along their length.

Figure 3A:
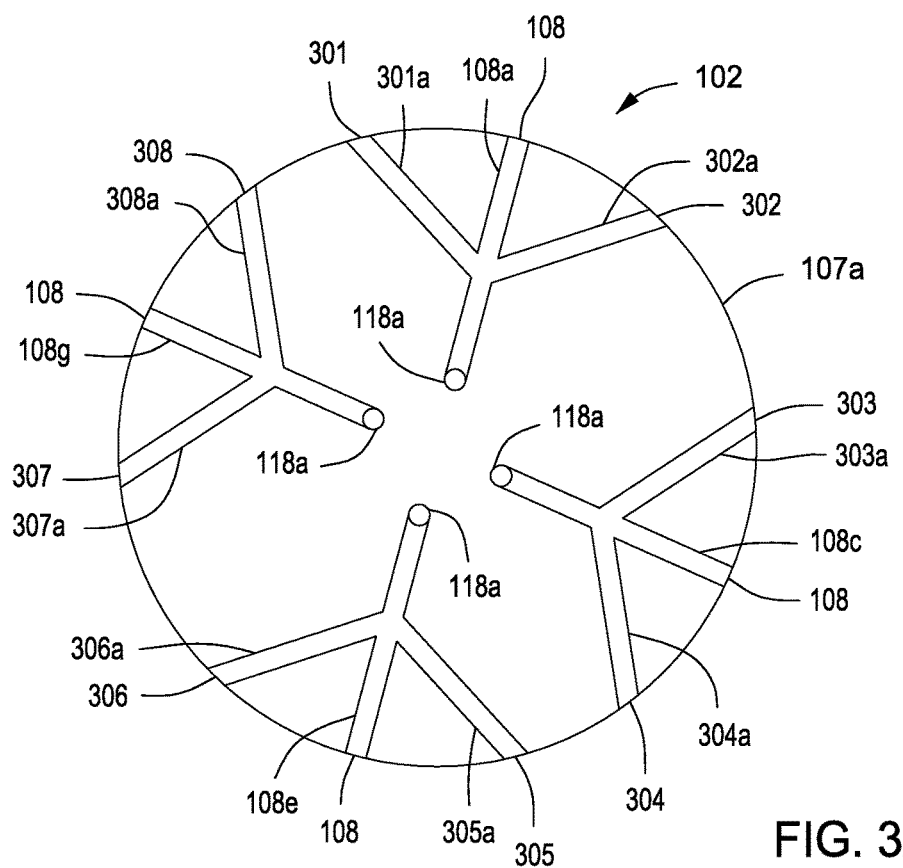
FIG. 3A depicts a mid-plane view taken along line III-III of FIG. 1 of a plate suitable for use in a substrate support in accordance with some embodiments of the present invention.
Figure 3B:
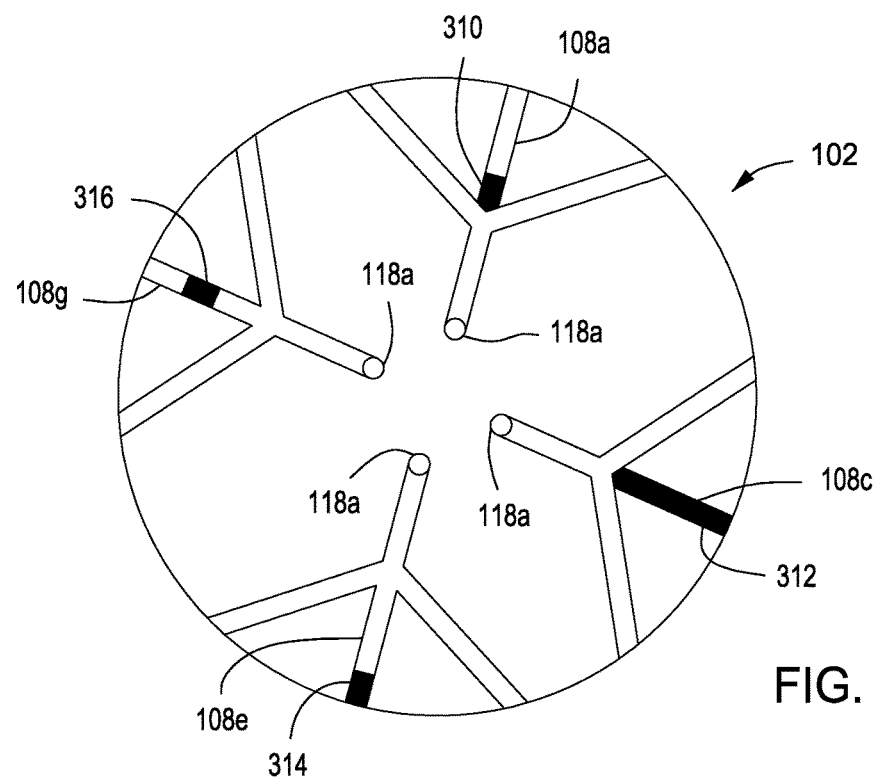
FIG. 3B depicts a mid-plane view taken along line III-III of FIG. 1 of a plate suitable for use in a substrate support in accordance with other embodiments of the present invention.

Additional or secondary horizontal passages may be provided as illustrated in FIGS. 3A and 3B. FIGS. 3A and 3B are mid-plane views through the thickness t taken along line III-III of FIG. 1 in the direction of second surface 106. In a non-limiting example, FIG. 3A illustrates a first plate 102 with four horizontal holes 108 and four horizontal passages 108a, 108c, 108e, and 108g. Additional or secondary horizontal holes 301-308 may be formed through the perimeter 107a from a location offset from a horizontal passage 108a, 108c, 108e, or 108g as illustrated and form secondary horizontal passages 301a-308a. Secondary horizontal passages 301a-308a may be the same size or shape as the horizontal passages 108a, 108c, 108e, or 108g as in FIG. 3A, or the secondary horizontal passages may be different in size or shape form the horizontal passages, and may vary in size of shape along their length. In embodiments with other horizontal passages, for example 108a-108h as in FIG. 2, secondary horizontal passages (not shown) may be the same size or shape as the primary horizontal passages, or may be different in size or shape and may vary in size of shape along their length.

Secondary horizontal passages 301a-308a may extend from the perimeter 107a and terminate at a horizontal passage, e.g. 108a-108g in FIG. 3A. For example, secondary horizontal hole 301 is formed in the perimeter 107a offset from horizontal hole 108 in a first, e.g., counterclockwise, direction. A first secondary horizontal passage 301a extends from the perimeter 107a and is directed to, and intersects with, horizontal passage 108a. The intersection produces fluid communication between the horizontal passage 108a and the secondary horizontal passage 301a.

Fluid communication between, for example, horizontal passage 108a and secondary horizontal passages 301a can be achieved by terminating secondary horizontal passages 301a within the primary horizontal passage. Alternately, secondary horizontal passages 301a may extend through horizontal passage 108a and terminate beyond the primary horizontal passage. To establish fluid communication in this example, at least part of the secondary horizontal passages 301a must intersect with at least part of horizontal passage 108a.

In some embodiments, one or more secondary horizontal passages may intersect a horizontal passage. For example, as shown in FIG. 3A each horizontal passage 108a-108g is intersected by two secondary passages 301a-308a. For example, horizontal passage 108a is intersected by secondary horizontal passages 301a and 302a. To achieve this, a secondary horizontal hole 302 is formed in the perimeter 107a offset from horizontal hole 108 in a second, e.g., clockwise, direction. A second secondary horizontal passage 302a extends from the secondary horizontal hole 302 in the perimeter 107a and is directed to, and intersects with, horizontal passage 108a. The intersection produces fluid communication between the horizontal passage and the secondary horizontal passage.

Fluid communication may be established between the second secondary horizontal passage and the primary horizontal passage as described above for the first secondary horizontal passage.

In some embodiments, the first secondary horizontal passage (e.g. 301a) and second secondary horizontal passage (e.g. 302a) intersect the first horizontal passage (e.g. 108a) at substantially the same distance along the first horizontal passage as measured from the perimeter 107a and illustrated in FIG. 3A. In other embodiments not shown, the first secondary horizontal passage and second secondary horizontal passage intersect the horizontal passage at different distances along the length of the horizontal passage.

The horizontal passages 108a-108g, or secondary passages 301a-308a may be formed and configured in size, shape, length, or other flow affecting characteristic such that desirable flow characteristics are achieved through each passage.

In some embodiments a portion of one or more passages, either primary passages (e.g., 108a-108h) or secondary passages (e.g., 301-308), may be at least partially blocked to limit fluid flow therethrough. In some embodiments, one or more passages may be completely blocked to prevent fluid flow. In non-limiting examples, portions of horizontal passages 108a, 108c, 108e, and 108g in FIG. 3B are shown at least partially blocked by plugs 310, 312, 314, and 316, respectively. Plugs 310-316 may be of any size, shape, or construction to partially or completely block fluid flow in the passages in which they are installed. One or more plugs may be placed along the length of a horizontal passage or a secondary horizontal passage as desired or required. As a non-limiting example, the plug illustrated as 310 may be used together with the plug illustrated as 314. Other combinations of plugs illustrated, or variations thereof, may be used. The plugs may be used to balance fluid flow in the passages, to redirect fluid flow, or to prevent fluid flow in all or part of a passage.

In embodiments where at least one of the vacuum passages 110a, primary passages (e.g., 108a-108h), and secondary passages (e.g., 301-308) are formed in the first plate 102 by at least drilling, boring, or gun drilling, the inventors have realized a reduction in manufacturing time and cost, and improved fluid flow through the holes and passages as compared to conventionally formed conduits.

Figure 4A:
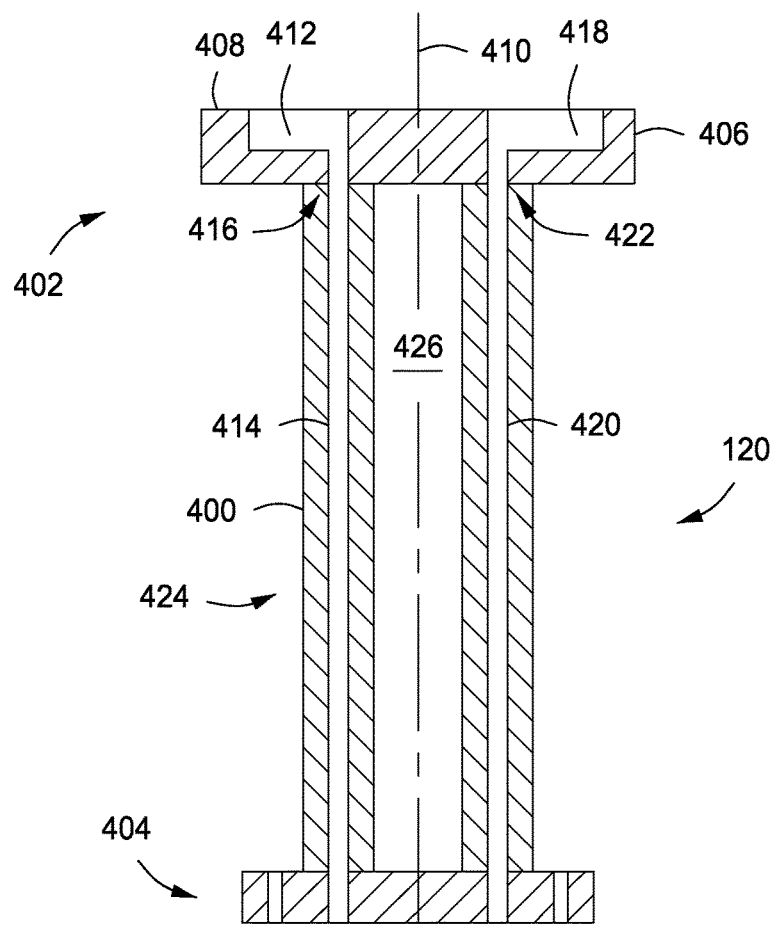
FIG. 4A depicts a cross-sectional side view a shaft and plate suitable for use in a substrate support in accordance with embodiments of the present invention.
Figure 4B:
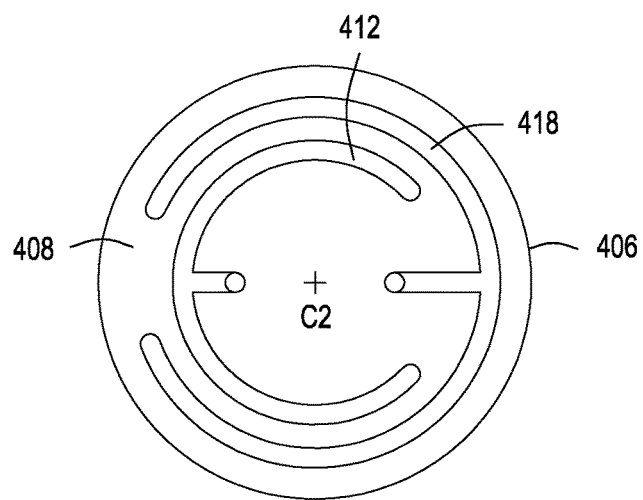
FIGS. 4B and 4C depict top views of an elongate shaft and plate suitable for use in a substrate support in accordance with embodiments of the present invention.
Figure 4C:
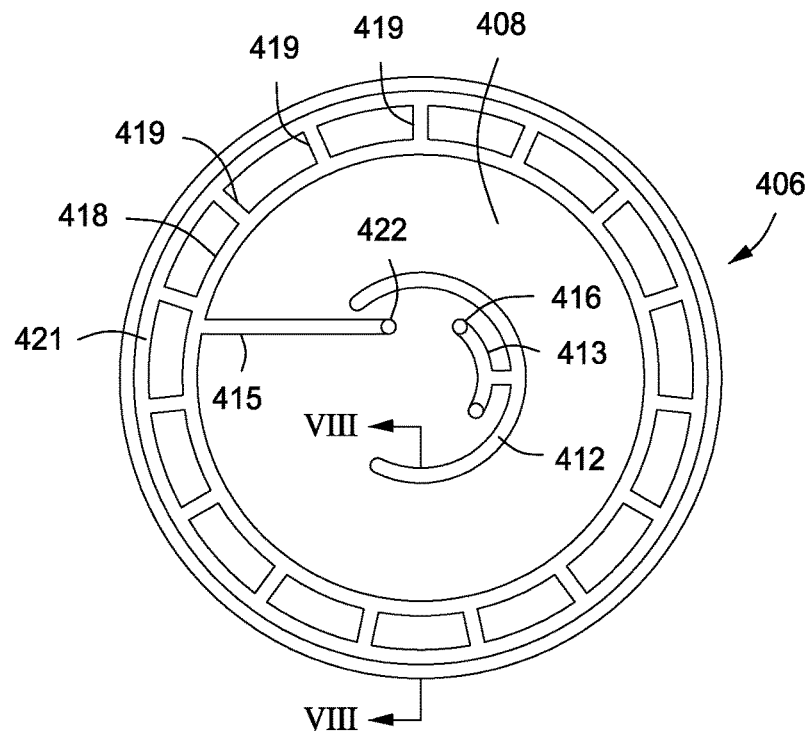

FIG. 4A depicts a cross-sectional side view and FIGS. 4B and 4C depict top views of an elongate shaft, or shaft 120, suitable for use in a substrate support in accordance with embodiments of the present invention. The shaft 120 can advantageously position the first plate 102 proximate to the process gas source, and can support the first plate 102 in rotational and/or vertical displacement, for example axial displacement along the axis of the shaft 120. The shaft 120 generally comprises a body 400 having a first end portion 402 and an opposite second end portion 404. The shaft 120 may be hollow, having one or more sidewalls 424 and a central opening 426. The body 400 may be fabricated from any material suitable to support the first plate 102, for example, a metal, such as aluminum, stainless steel, nickel-based alloys such as Hastelloy®, or non-metallic materials, such as ceramic.

Vacuum line 414 and edge purge line 420 may be formed or otherwise disposed within the body 400 of the shaft 120. In embodiments where the vacuum line 414 and the edge purge line 420 are formed in the body 400 of the shaft 120 (i.e., internal to the shaft), the inventors have discovered that the vacuum line 414 and the edge purge line 420 are less susceptible to degradation or failure as compared to conventional substrate support shafts that utilized separate components to form conduits.

First end portion 402 includes a second plate 406, the second plate comprising a top surface 408 perpendicular to shaft axis 410. The second plate 406 may be integrally formed with the body 400 or separately formed. The second plate 406 may be the same size as the first plate 102, or the second plate 406 may be larger or smaller that the first plate 102.

Formed in the top surface 408 of second plate 406 is an exemplary vacuum channel 412 in fluid communication with first end 416 of vacuum conduit or line 414 as illustrated in FIG. 4B. Formed in the top surface 408 is an exemplary edge purge channel 418 in fluid communication with edge purge conduit or line 420 at a first end 422 of edge purge line 420.

FIG. 4C is illustrative of an exemplary C-shaped vacuum channel 412 and circular edge purge channels 418 and 421 formed in top surface 408 of second plate 406. The vacuum channel 412 is in fluid communication with the first end 416 of vacuum line 414 (not shown in this figure) through vacuum leader channel 413. Vacuum leader channel 413 is illustrated as comprising an arcuate portion and a linear portion in a non-limiting example. Other vacuum leader channels comprising one or more leader channels of other configurations are contemplated.

Formed in the top surface 408 of second plate 406 is an exemplary circular edge purge channel 418 as illustrated in FIG. 4C. The edge purge channel 418 is in fluid communication with the first end 422 of edge purge line 420 (not shown in this figure) through edge purge leader channel 415. Edge purge leader channel 415 is illustrated as a linear channel for convenience. Edge purge leader channels with other configurations are contemplated.

As illustrated in the non-limiting embodiment of FIG. 4C, edge purge channel 418 is in fluid communication with a plurality of edge purge distribution channels 419 (15 shown) for delivery of the edge purge gases to a second edge purge channel 421. The number of edge purge distribution channels 419 used may be greater or less than the 15 shown.

Applicants have found that the edge purge gas distribution as illustrated in FIGS. 4A-4C advantageously provide uniform distribution of edge purge gas to the perimeter if the second plate 406. Uniform edge purge gas distribution may beneficially increase process uniformity and repeatability.

In non-limiting embodiments, the paths of vacuum channel 412 and edge purge channel 418 may be formed in the top surface 408 as arcuate shapes as illustrated in FIG. 4B, each channel path having a uniform radius of curvature, one of different magnitude from the other such that they do not intersect. One or both of the arcuate shapes may have an angular measure of less than 360° (i.e., form less than a complete circular path, or generally "C" shaped) as illustrated. The inventors have noted that under certain conditions, "C" shaped channels advantageously create enhanced vacuum formation and distribution to the vacuum passages 110a as compared to a channel forming a complete circle. In other embodiments, the paths may have an angular measure of 360° (i.e., form a complete circular path). Paths other than arcuate paths may used in some embodiments.

In some embodiments, the vacuum channel 412, the edge purge channel 418, or both, may be comprised of separate portions, each portion formed discontinuously with the other, or others, with each portion in fluid communication with the vacuum line 414 or edge purge line 420 as appropriate.

Figure 5:
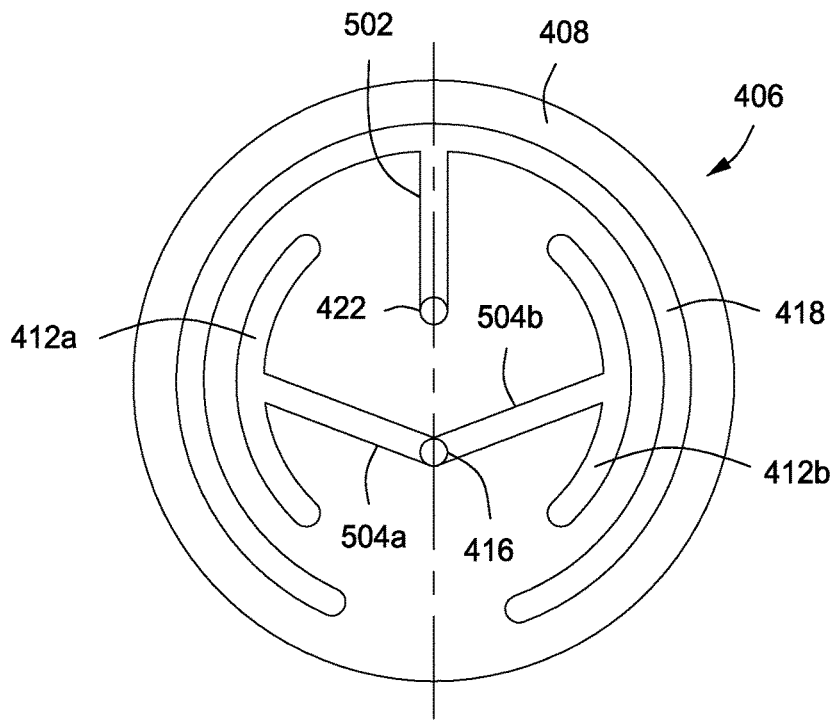
FIG. 5 represents a plan view of a first end of a shaft suitable for use in a substrate support in accordance with some embodiments of the present invention.

FIG. 5 is illustrative of a non-limiting example of a channel formed of two discontinuous portions, each in fluid communication with a vacuum line or a gas line as appropriate. FIG. 5 is a plan view of a top surface 408 of a second plate 406 similar to that illustrated in FIG. 4. As illustrated in FIG. 5, top surface 408 of second plate 406 comprises edge purge channel 418 in fluid communication with first end 422 of edge purge line 420 (not shown in this view) through runner or leader 502. Vacuum channels are formed in the top surface 408 as two separate discontinuous portions 412a and 412b, each in fluid communication with first end 416 of vacuum line 414 (not shown) through runner or leader 504a and 504b.

For ease of illustration only, the vacuum channel is illustrated as comprising two discontinuous portions 412a, 412b, although more than two discontinuous portions may be used. Also for ease of illustration, only the vacuum channel is shown as comprising discontinuous portions. In other embodiments, the edge purge channel 418 may be comprised of two or more discontinuous portions, regardless of the construction of the vacuum channel or channels. Symmetry is shown about a centerline in FIG. 5. In other embodiments symmetry may or may not be found.

The vacuum channel 412 (or portions 412a, 412b) and edge purge channel 418 (or channels) are configured such that top surface 408 may be placed adjacent second surface 106 such that the vacuum channel 412 (or portions 412a, 412b) is aligned with and in fluid communication with vacuum passages 110a in the first plate 102 and such that edge purge channel 418 (or channels) is aligned with and in fluid communication with vertical holes 118 in the first plate 102. In some embodiments, appropriate alignment can be achieved by placing a plate center point, for example C1 on second surface 106 (FIG. 2) in alignment with a top surface center point, for example C2 on top surface 408 (FIG. 4), and bringing second surface 106 in an abutting relationship with top surface 408. In some embodiments, radial positioning of the second plate 406 with respect to the first plate 102 may be helpful in aligning the vacuum channel(s) with the vacuum holes and the edge purge channel(s) with the vertical holes.

The second plate 406 and the first plate 102 may be affixed together using known methods, such as, but not limited to, bolting, welding, brazing, adhesion bonding, mechanical interlock, or chemical joining.

Figure 6:
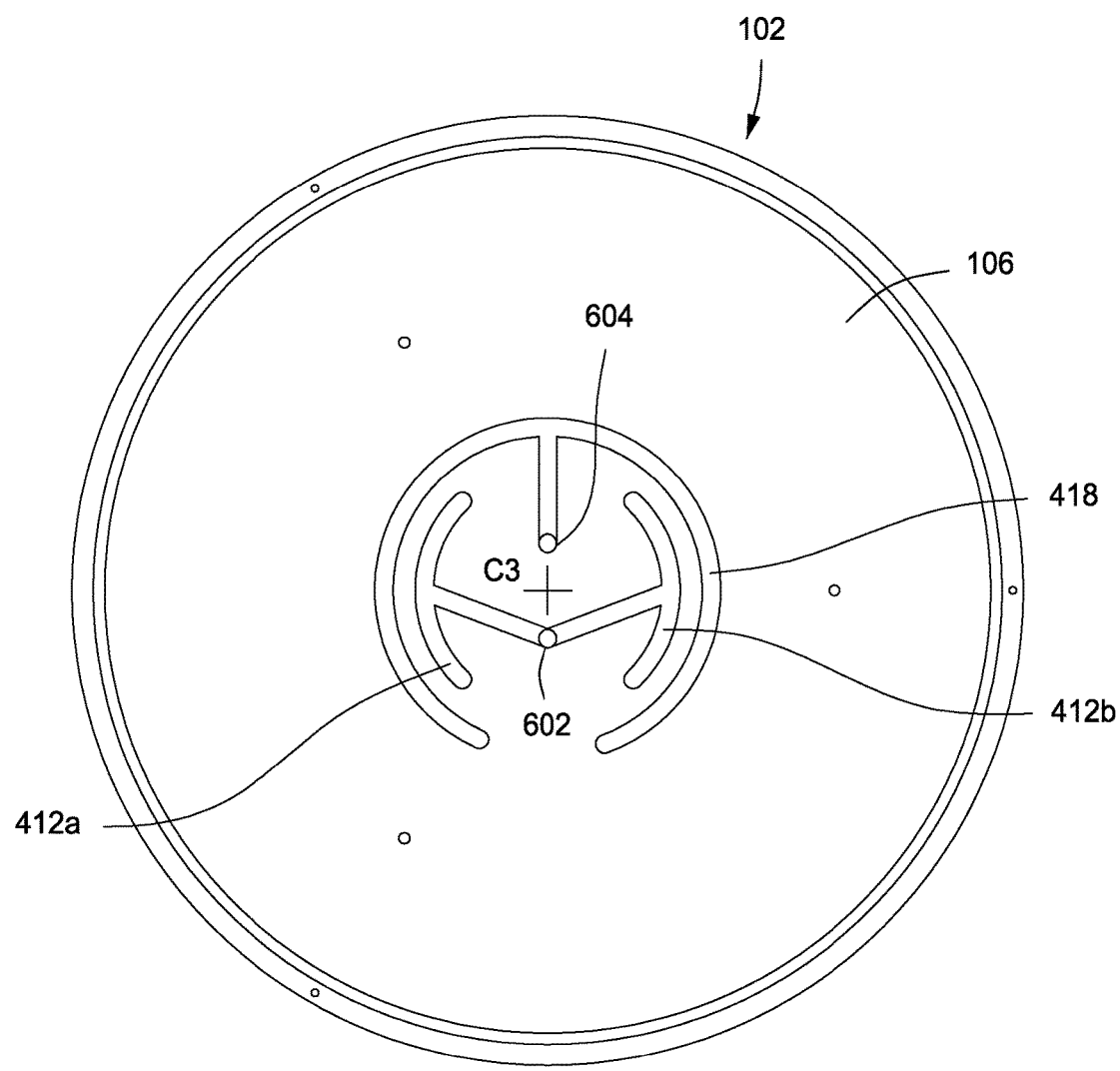
FIG. 6 depicts a bottom plan view of a plate in accordance with some embodiments of the present invention.

In some embodiments, the vacuum channel(s), the edge purge channel(s), or both the vacuum channel(s) and the edge purge channel(s) may be formed in the second surface 106. As a non-limiting example, FIG. 6 illustrates second surface 106 with discontinuous vacuum channel portions 412a and 412b, and edge purge channel 418 in a configuration similar to that of the top surface illustrated in FIG. 5. Vacuum channel portions 412a, 412b are in fluid communication with a common vacuum hole 602. Vacuum hole 602 may be in fluid communication with first end 416 of vacuum line 414 (not shown). Edge purge channel 418 may be in fluid communication with an edge purge hole 604, or may be in direct fluid communication with first end 422 of edge purge line 420 (not shown in this view). As discussed above, the vacuum channel may comprise more than two discontinuous channels, or may be formed as a continuous channel. Similarly, the edge purge channel may be formed as two or more discontinuous channels or as a continuous channel.

In embodiments in which a vacuum channel or an edge purge channel are formed in the second surface 106, one or more corresponding channels may be formed in the top surface 408 (for example as in FIG. 4). The channels formed in the top surface 408 may or may not be in the same configuration as the channels formed in the second surface 106. In some embodiments, the top surface 408 may have portions which correspond with the channels in the second surface 106.

Figure 7:
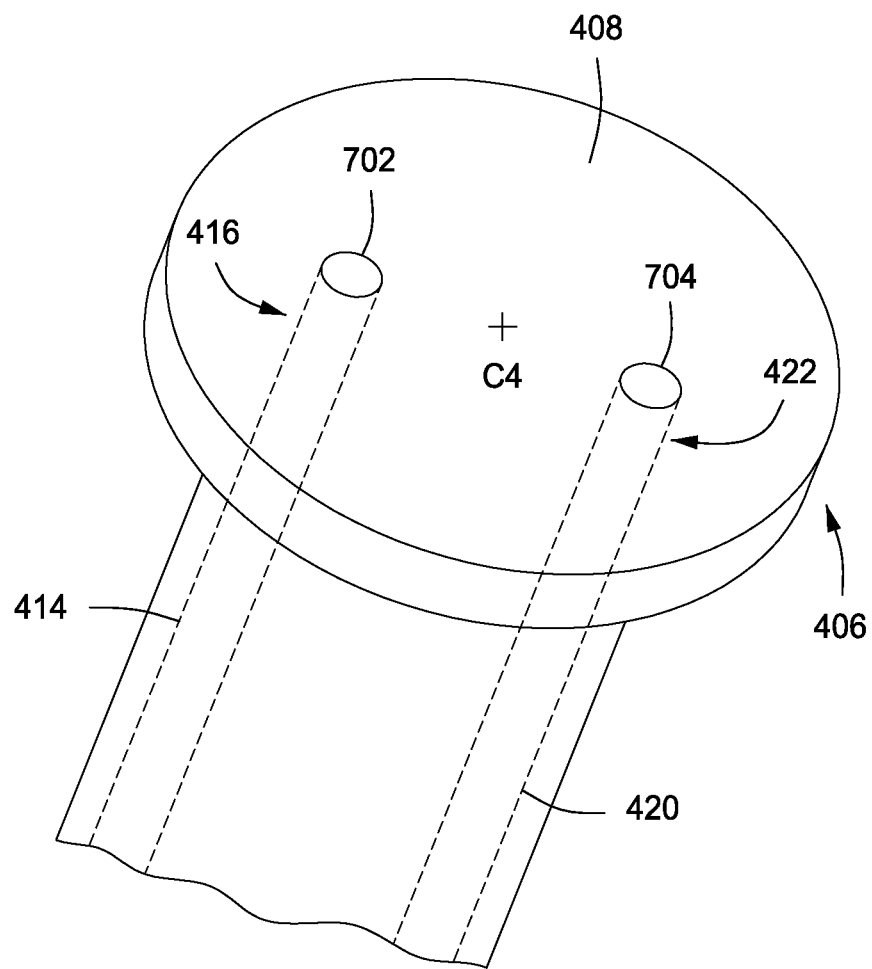
FIG. 7 depicts a perspective view of a portion of a shaft for a substrate support in accordance with some embodiments of the present invention.

Alternately, top surface 408 may be formed without channels. In one non-limiting embodiment illustrated in FIG. 7, first end 416 of vacuum line 414 and first end 422 of edge purge line 420 terminate at the top surface 408 at vacuum hole 702 and edge purge hole 704.

The vacuum hole 702 and edge purge hole 704 are configured such that top surface 408 may be placed adjacent second surface 106 configured as shown in FIG. 6, such that the vacuum channel portions 412a, 412b are aligned with and in fluid communication with vacuum hole 702 in top surface 408 and such that edge purge channel 418 are aligned with and in fluid communication with edge purge hole 704 in top surface 408. In some embodiments, appropriate alignment can be achieved by placing a first plate center point, for example C3 on second surface 106 (FIG. 6)

in alignment with a center point of the top surface 408, for example C4 on top surface 408 (FIG. 7), and bringing the second surface 106 in an abutting relationship with top surface 408. In some embodiments, radial positioning of the second plate 406 with respect to the first plate 102 may be helpful in aligning the vacuum channel(s) with the vacuum port and the edge purge channel(s) with the vertical holes.

In some embodiments, vacuum hole 602 may align with and be in fluid communication with vacuum hole 702. Similarly, in some embodiments, edge purge hole 604 may align with and be in fluid communication with edge purge hole 704. In further embodiments, vacuum hole 602 may align with and be in fluid communication with vacuum hole 702 and edge purge hole 604 may align with and be in fluid communication with edge purge hole 704.

Referring back to FIGS. 3A and 3B, the mid-plane view of the first plate 102 illustrates horizontal passage 108a terminating at a first end at the perimeter 107a and at a second end at a vertical passage 118a formed through second surface 106 (not shown in FIG. 3A or 3B) and partially through the thickness t to a depth sufficient to at least partially intersect with and establish fluid communication with horizontal passages 108a.

Figure 8:
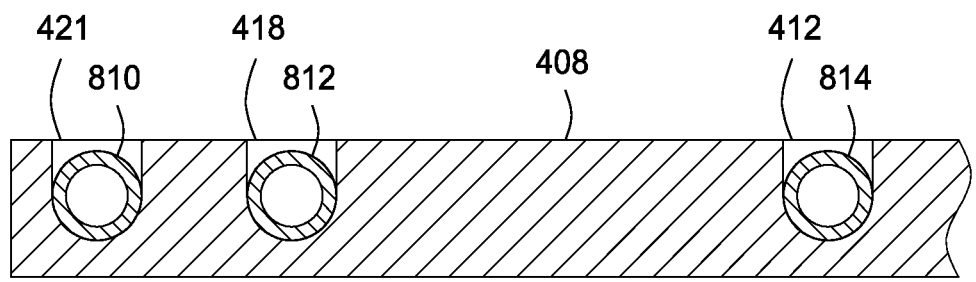
FIG. 8 depicts a cross sectional view of a portion of the plate of FIG. 4C taken along line VIII-VIII.

In embodiments comprising at least passages (e.g., 108a-108h, 301a-308a), vacuum line 414, edge purge line 420, or channels (e.g., 412, 418, 421), the passages, lines or channels may be lined with tubes as illustrated in FIG. 8. Advantageously, the tubes may prevent, or at least decrease, contamination in the fluid stream carried within the passages. For example, if the passages are unlined, edge purge gases may become contaminated with filler material or out-gassing from the first plate 102. Tubes fabricated from non-reactive materials, for example stainless steel, nickel, or a nickel-based alloy, such as Hastelloy®, may reduce or eliminate the possibility of fluid stream contamination. Following formation of the passages, lines, or channels, suitably sized tubes can be placed within the passages or lines and sealed against contamination as appropriate.

FIG. 8 represents a cross sectional view of the second plate 406 taken along line VIII-VIII of FIG. 4C. In the non-limiting embodiment illustrated, tubes 810, 812 are placed in edge purge channels 421, 418, respectively. In some embodiments, it may be desirable to place tubes within vacuum channels to achieve similar results as discussed above. FIG. 8 also illustrates an exemplary embodiment in which tube 814 is placed in vacuum channel 412.

Edge purge channel 418 is in fluid communication with edge purge channel 421 through a plurality of edge purge distribution channels 419 (15 shown). Fluid communication can be maintained when tubes 810, 812 are placed in edge purge channels 418 and 421 by fluidly connecting tubes 810 and 812 with a connecting tube placed in the edge purge distribution channels 419 and connected for fluid communication with tubes 810 and 812. The connecting tube may be fluidly joined to tubes 810 and 812 by brazing, welding, or other metal joining procedures.

Thus, embodiments of a substrate support with integrated vacuum and edge purge conduits that may provide one or more of an easily established or maintained vacuum connection between the shaft and the plate and an easily established or maintained edge purge gas or fluid connection between the shaft and the plate have been provided herein.

While the foregoing is directed to embodiments of the present invention, other and further embodiments of the invention may be devised without departing from the basic scope thereof.

The invention claimed is:

1. A substrate support, comprising:
a first plate;
a plurality of vacuum passages disposed through the first plate;
a plurality of vertical passages formed partially into the first plate;
a plurality of horizontal passages disposed in the first plate, each of the plurality of horizontal passages beginning at a peripheral surface of the first plate and terminating proximate one of the plurality of vertical passages such that the horizontal passages and the vertical passages are in fluid communication;
a second plate coupled to the first plate at an interface;
an elongate shaft having a vacuum line and an edge purge line formed in a body of the shaft, wherein the elongate shaft is coupled to the second plate at a first end portion of the elongate shaft;
a vacuum channel formed at the interface and fluidly coupled to the vacuum line and the plurality of vacuum passages, wherein the vacuum line serves as an inlet of the vacuum channel and the plurality of vacuum passages serve as outlets of the vacuum channel; and
an edge purge channel formed at the interface and fluidly coupled to the edge purge line to distribute purge gas to the plurality of vertical passages, wherein the edge purge line serves as an inlet of the edge purge channel and the plurality of vertical passages serve as outlets of the edge purge channel,
wherein the vacuum and edge purge channels are defined by the first and second plates at the interface and are parallel to the interface.

2. The substrate support of claim 1, wherein the first plate further comprises a first secondary horizontal passage beginning at a point on the perimeter of the first plate offset in a first direction from the beginning of a primary horizontal passage and terminating at an intersection with the primary horizontal passage such that the first secondary horizontal passage is in fluid communication with the primary horizontal passage.

3. The substrate support of claim 2, wherein the first plate further comprises a second secondary horizontal passage beginning at a point on the perimeter of the first plate offset in a second direction, opposite the first direction, from the beginning of the primary horizontal passage and terminating at an intersection with the primary horizontal passage such that the second secondary horizontal passage is in fluid communication with the primary horizontal passage.

4. The substrate support of claim 3, wherein the first secondary horizontal passage and second secondary horizontal passage intersect the primary horizontal passage at a substantially same distance from the beginning of the primary horizontal passage.

5. The substrate support of claim 4, wherein a portion of the horizontal passage between the intersection of at least one of the first and second secondary horizontal passages and the perimeter of the first plate is at least partially blocked to limit or prevent fluid flow therethrough.

6. The substrate support of claim 1, wherein the vacuum channel and the edge purge channels are arcuate.

7. The substrate support of claim 6, wherein the vacuum channel and the edge purge channels have uniform radii of curvature of different magnitude.

8. The substrate support of claim 1, wherein the vacuum channel comprises a plurality of discontinuous curvilinear portions, each portion in fluid communication with the vacuum line.

9. The substrate support of claim 1, wherein the first plate, the second plate, and the shaft comprise ceramic materials.

10. The substrate support of claim 1, further comprising:
a plate rim raised above a first surface of the first plate, the plate rim providing a sealing surface with respect to a substrate when disposed on the first plate; and
a plurality of substrate support elements raised above the first surface and disposed radially inward of the plate rim.

11. The substrate support of claim 10, wherein the sealing surface includes a coating formed on the sealing surface.

12. The substrate support of claim 11, wherein the coating is discontinuous.

13. The substrate support of claim 11, wherein the coating comprises a non-metallic material.

14. The substrate support of claim 13, wherein the coating comprises aluminum oxide.

15. The substrate support of claim 1, wherein at least one of the vacuum passages, vertical passages, horizontal passages, vacuum line, or edge purge line include liner tubes inserted therein.

16. The substrate support of claim 1, wherein at least one of the edge purge channel and the vacuum channel is at least partially formed in a surface of the first plate disposed adjacent to the second plate.

17. The substrate support of claim 1, wherein at least one of the edge purge channel and the vacuum channel is at least partially formed in a surface of the second plate disposed adjacent to the first plate.

18. A substrate support, comprising:
a plate comprising:
a first surface, an opposing second surface, and a thickness bounded by the first and second surfaces;
a rim raised above the first surface, the rim including a sealing surface comprising a discontinuous coating;
a plurality of vacuum passages formed through the thickness and the first and second surfaces;
a plurality of vertical passages formed through the second surface and partially through the plate; and
a plurality of horizontal passages disposed in the thickness of the plate, each of the plurality of horizontal passages beginning at a peripheral surface of the plate, and terminating at one of the plurality of vertical passages such that the horizontal passages and the vertical passages are in fluid communication;
a second plate coupled to the plate at an interface;
an elongate shaft having a vacuum line and an edge purge line formed in a body of the shaft, wherein the elongate shaft is coupled to the second plate at a first end portion of the elongate shaft;
a vacuum channel formed at the interface and fluidly coupled to the vacuum line and the plurality of vacuum passages, wherein the vacuum line serves as an inlet of the vacuum channel and the plurality of vacuum passages serve as outlets of the vacuum channel; and
an edge purge channel formed at the interface and fluidly coupled to the edge purge line to distribute purge gas to the plurality of vertical passages, wherein the edge purge line serves as an inlet of the edge purge channel and the plurality of vertical passages serve as outlets of the edge purge channel,
wherein the vacuum and edge purge channels are defined by the plate and the second plate at the interface and are parallel to the interface.

19. The substrate support of claim 18, wherein the discontinuous coating comprises aluminum oxide.

20. A substrate support, comprising:
a first plate comprising:
a first surface, an opposing second surface, and a thickness bounded by the first and second surfaces;
a plurality of vacuum passages formed through the thickness and the first and second surfaces;
a plurality of vertical passages formed through the second surface and partially through the first plate; and
a plurality of horizontal passages disposed in the first plate, each of the plurality of horizontal passages beginning at a peripheral surface of the first plate, and terminating near one of the plurality of vertical passages such that the horizontal passages and the vertical passages are in fluid communication;
a second plate comprising a top surface and an opposing bottom surface, wherein the top surface of the second plate is coupled to the second surface of the first plate at an interface;
an elongate shaft comprising a first end and an opposite second end, wherein the elongate shaft is coupled to the second plate at the first end, and wherein the shaft further comprises:
a vacuum line formed in a body of the shaft, the vacuum line having a first end at the first end of the shaft; and
an edge purge line formed in a body of the shaft, the edge purge line having a first end at the first end of the shaft;
a vacuum channel formed at the interface and fluidly coupled to the vacuum line and the plurality of vacuum passages, wherein the vacuum line serves as an inlet of the vacuum channel and the plurality of vacuum passages serve as outlets of the vacuum channel; and
an edge purge channel formed at the interface and fluidly coupled to the edge purge line to distribute purge gas to the plurality of vertical passages, wherein the edge purge line serves as an inlet of the edge purge channel and the plurality of vertical passages serve as outlets of the edge purge channel,
wherein the vacuum and edge purge channels are defined by the first and second plates at the interface and are parallel to the interface.

* * * * *